(12) United States Patent
Huang et al.

(10) Patent No.: US 7,525,355 B2
(45) Date of Patent: Apr. 28, 2009

(54) DIGITAL DELAY LOCKED LOOP

(75) Inventors: Hong-Yi Huang, Taipei (TW);
Shiun-Dian Jan, Taipei County (TW);
Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/748,497

(22) Filed: May 15, 2007

(65) Prior Publication Data

US 2008/0143403 A1    Jun. 19, 2008

(30) Foreign Application Priority Data

Dec. 15, 2006   (TW) .............................. 95147032 A

(51) Int. Cl.
*H03L 7/06* (2006.01)
(52) U.S. Cl. ...................... 327/158; 327/149
(58) Field of Classification Search ....................... None
See application file for complete search history.

(56) References Cited

U.S. PATENT DOCUMENTS 6,388,482 B1 * 5/2002 Schnell et al. .............. 327/158
2006/0044021 A1 * 3/2006 Wang ............................ 327/2

OTHER PUBLICATIONS

Article titled "All Digital Pulsewidth Control Loop With Real Time Output" jointly authored by Hong-Yi Huang and Shin-Dian Jan , in the 17th VLSI Design/CAD Symposium, Aug. 8-11, 2006, (4 pages).

* cited by examiner

*Primary Examiner*—Cassandra Cox
(74) *Attorney, Agent, or Firm*—Jianq Chyun IP Office

(57) ABSTRACT

A digital delay locked loop including a plurality of controllable delay circuits connected in series, a phase detecting unit, and a delay control unit is disclosed. As an output end of each of the controllable delay circuits is coupled to the phase detecting unit, the phase detecting unit samples a positive received signal at the transition points of a specific period signal transmitted by each of the controllable delay circuits.

21 Claims, 11 Drawing Sheets

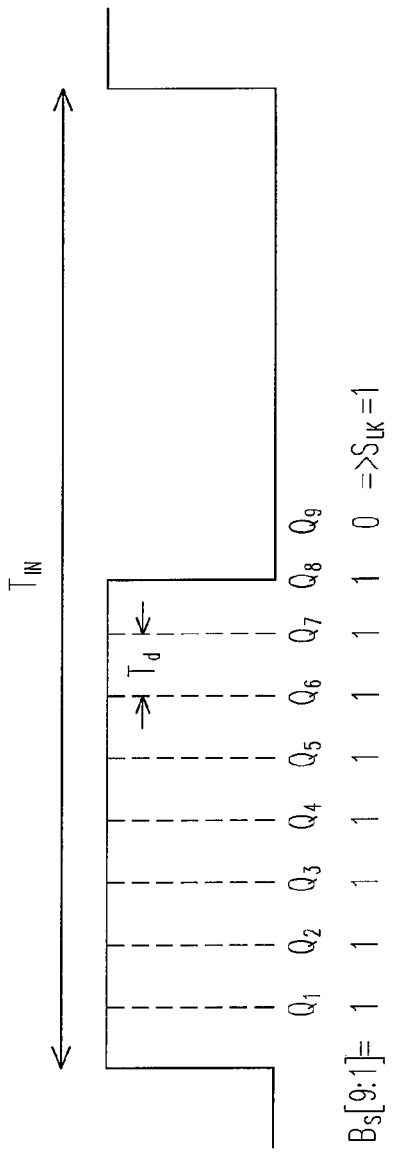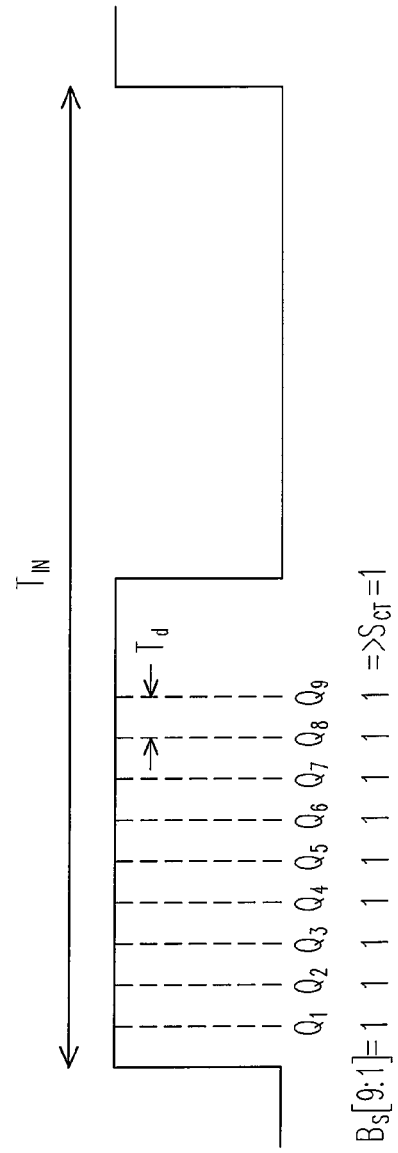

DIGITAL DELAY LOCKED LOOP

CROSS-REFERENCE TO RELATED APPLICATION

This application claims the priority benefit of Taiwan application serial no. 95147032, filed Dec. 15, 2006. All disclosure of the Taiwan application is incorporated herein by reference.

BACKGROUND OF THE INVENTION

1. Field of the Invention

The present invention relates to a digital delay locked loop. More particularly, the present invention relates to a digital delay locked loop that detects phases according to a specific period signal transmitted by each of a plurality of controllable delay circuits.

2. Description of Related Art

Delay locked loops are mainly used for synchronizing and tracking of clock signals among different circuit systems. For example, in high-speed microprocessors, the delay locked loops are used to eliminate asynchronism between external clock signals and internal clock signals. In communication systems, the delay locked loops are used to recover clocks or data of the systems. Therefore, the delay locked loops are indispensable basic components in many system applications.

FIG. 1 is a basic architectural view of a conventional delay locked loop. Referring to FIG. 1, a conventional delay locked loop 100 forms a feedback mechanism with a phase detector 110, a controller 120, and a delay line 130. The phase detector 110 detects a phase difference between an external clock signal $V_{OUT}$ and an internal clock signal $V_{IN}$, so as to generate a phase detection code $B_{f1}$. The controller 120 can acquire whether the external clock signal $V_{OUT}$ is before or after the internal clock signal $V_{IN}$ according to the phase detection code $B_{f1}$. Thus, the delay line 130 can regulate the delay time of the internal clock signal $V_{IN}$ according to a delay control code $B_{d1}$ generated by the controller 120. Accordingly, the conventional delay locked loop 100 keeps regulating the external clock signal $V_{OUT}$ until the external clock signal $V_{OUT}$ is synchronous with the internal clock signal $V_{IN}$ by the use of the above feedback mechanism.

However, the conventional delay locked loop 100 adopts a mixed-mode design, which incurs many inevitable problems. For example, the conventional delay locked loop 100 cannot be developed to be highly integrated, and is quite sensitive to variations of process parameters including voltage and temperature. In addition, as the locked time of the conventional delay locked loop 100 is too long, so the power consumption will be excessively high.

SUMMARY OF THE INVENTION

The present invention is directed to a digital delay locked loop capable of sampling phases according to a specific period signal transmitted by each of a plurality of controllable delay circuits.

The present invention is also directed to a digital delay locked loop, which uses a phase detecting unit together with a plurality of controllable delay circuits to sample a positive received signal.

The present invention provides a digital delay locked loop, which includes a plurality of controllable delay circuits connected in series, a phase detecting unit, and a delay control unit. Each of the controllable delay circuits transmits a specific period signal according to delay time determined by a delay control code. The phase detecting unit coupled to each of the controllable delay circuits samples the specific period signal at the transition points of the specific period signal transmitted by each of the controllable delay circuits, so as to generate a sample output code. The phase detecting unit determines the sample output code to provide a counting information. When the sample output code is a specific sample code, the digital delay locked loop remains in the locked state.

The delay control unit enables the delay control code to increase or reduce according to the counting information. The delay control unit, the controllable delay circuits, and the phase detecting unit form a feedback mechanism. Therefore, the digital phase locked loop keeps regulating the delay control code through the feedback mechanism until the locked state is assumed.

In another aspect, the present invention further provides a digital delay locked loop, for regulating a positive received signal to a phase locked signal. The digital delay locked loop includes a plurality of controllable delay circuits connected in series, a phase detecting unit, and a delay control unit. Each of the controllable delay circuits sequentially transmits the positive received signal and a negative received signal according to delay time determined by a delay control code, and the positive received signal and the negative received signal form a specific period signal. The phase detecting unit coupled to each of the controllable delay circuits samples the positive received signal at the transition points of the specific period signal transmitted by each of the controllable delay circuits. Then, the phase detecting unit provides a counting information or a locked information by judging the sample output code.

The delay control unit provides and regulates the delay control code according to the counting information and the locked information. The delay control unit, the controllable delay circuits, and the phase detecting unit form a feedback mechanism. Therefore, according to the counting information, the delay control unit keeps increasing or reducing the delay control code through the feedback mechanism until the digital delay locked loop remains in the locked state. The digital delay locked loop remains in the locked state according to the locked information, and uses one of the plurality of controllable delay circuits to generate a phase locked signal.

As the present invention adopts the architecture that output ends of the plurality of controllable delay circuits are coupled to the phase detecting unit, the phase detecting unit can sample the positive received signal at the transition points of the specific period signal transmitted by each of the controllable delay circuits.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a sampling timing diagram of a phase detecting unit when the digital phase locked loop remains in the locked state.

FIG. 4 is a sampling timing diagram of the phase detecting unit when the delay control code is too small.

DESCRIPTION OF EMBODIMENTS

Figure 1:
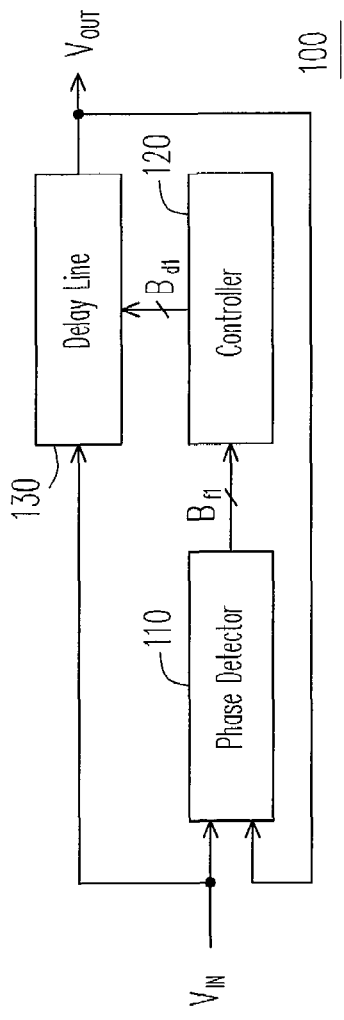
FIG. 1 is a basic architectural view of a conventional delay locked loop.
Figure 2:
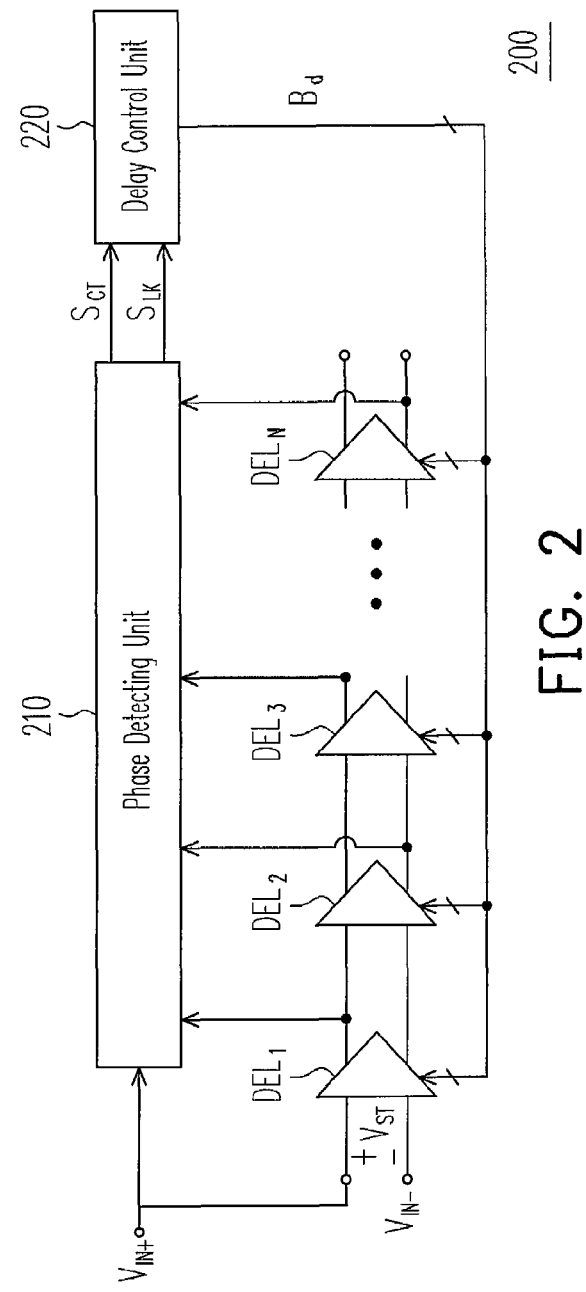
FIG. 2 is an architectural view of a digital phase locked loop according to an embodiment of the present invention.

FIG. 2 is an architectural view of a digital phase locked loop according to an embodiment of the present invention. Referring to FIG. 2, a digital phase locked loop 200 includes a phase detecting unit 210, controllable delay circuits $DEL_1$-$DEL_N$, and a delay control unit 220, where N is an integer greater than 0. The controllable delay circuits $DEL_1$-$DEL_N$ are connected in series, and output ends of the controllable delay circuits $DEL_1$-$DEL_N$ are coupled to the phase detecting unit 210. The delay control unit 220 is coupled to the phase detecting unit 210.

Referring to FIG. 2, the controllable delay circuits $DEL_1$-$DEL_N$ of this embodiment employs a double-ended design, so a specific period signal $V_{ST}$ defined in this embodiment includes a positive received signal $V_{IN+}$ and a negative received signal $V_{IN-}$. Here, the digital phase locked loop 200 is used to regulate the positive received signal $V_{IN+}$ to a phase locked signal. It should be noted that the duty cycle of the specific period signal is 50%, and the positive received signal $V_{IN+}$ and the phase locked signal have opposite phases. In other words, the specific period signal $V_{ST}$ and the phase locked signal also have opposite phases. The operating mechanism of the digital phase locked loop 200 will be illustrated below.

Here, the controllable delay circuits $DEL_1$-$DEL_N$ transmit the specific period signal $V_{ST}$ according to the delay time determined by the delay control code Bd. In another aspect, the phase detecting unit 210 samples the positive received signal $V_{IN+}$ in the specific period signal $V_{ST}$ at the transition points of the specific period signal $V_{ST}$ transmitted by each of the controllable delay circuits to generate a sample output code. Next, the phase detecting unit 210 provides a counting information $S_{CT}$ or a locked information $S_{LK}$ by judging the sample output code. The digital delay locked loop 200 remains in the locked state according to the locked information $S_{LK}$, and generates the phase locked signal through one of the controllable delay circuits $DEL_1$-$DEL_N$. In addition, the digital delay locked loop 200 acquires whether the delay control code Bd is over large or too small according to the counting information $S_{CT}$.

For example, it is assumed that the digital phase locked loop 200 includes $2^K+1$ controllable delay circuits ($N=2^K+1$), the resolution of the sample output code is $2^K+1$ bits which are represented as Bs[1]-Bs[$2^K+1$] respectively, wherein K is a positive integer. Then, K=3 is taken as an example in the description below. When the phase detecting unit 210 outputs the locked information $S_{LK}$, the sampling timing diagram of the phase detecting unit 210 is as shown in FIG. 3, wherein $Q_1$-$Q_9$ denote sampling points that the controllable delay circuits $DEL_1$-$DEL_9$ provide to the phase detecting unit 210, and Td denotes the delay time determined by the controllable delay circuits $DEL_1$-$DEL_9$ according to the delay control code Bd. In the locked state, the total delay time of the controllable delay circuits $DEL_1$-$DEL_8$ is equal to ½ time period (½ $T_{IN}$) of the positive received signal $V_{IN+}$. Therefore, the sample output code Bs[9:1] obtained at the sampling points Q1-Q9 is 011111111. Then, the phase detecting unit 210 generates the locked information $S_{LK}$ at a logic high level (e.g., logic 1) by judging the sample output code Bs[9:1]. At this time, the digital phase locked loop 200 outputs the phase locked signal through the controllable delay circuit $DEL_8$.

Furthermore, when the delay locked loop 200 remains in the locked state, the sample output code is equal to a specific sample code with a resolution of $2^K+1$ bits, wherein the $1^{st}$ to the $2^K{}^{th}$ bits are at high level (e.g., logic 1), and the $(2^K+1)^{th}$ bit is at low level (e.g., logic 0). Thus, the phase detecting unit 210 can generate the locked information $S_{LK}$ at the logic high level accordingly.

In other words, the Boolean formula of the locked information $S_{LK}$ is expressed as Formula (1):

$$S_{LK}=(Bs[1]\cdot Bs[2]\cdot Bs[3]\ldots Bs[2^K])\cdot \overline{Bs[2^K+1]} \qquad (1)$$

Figure 5:
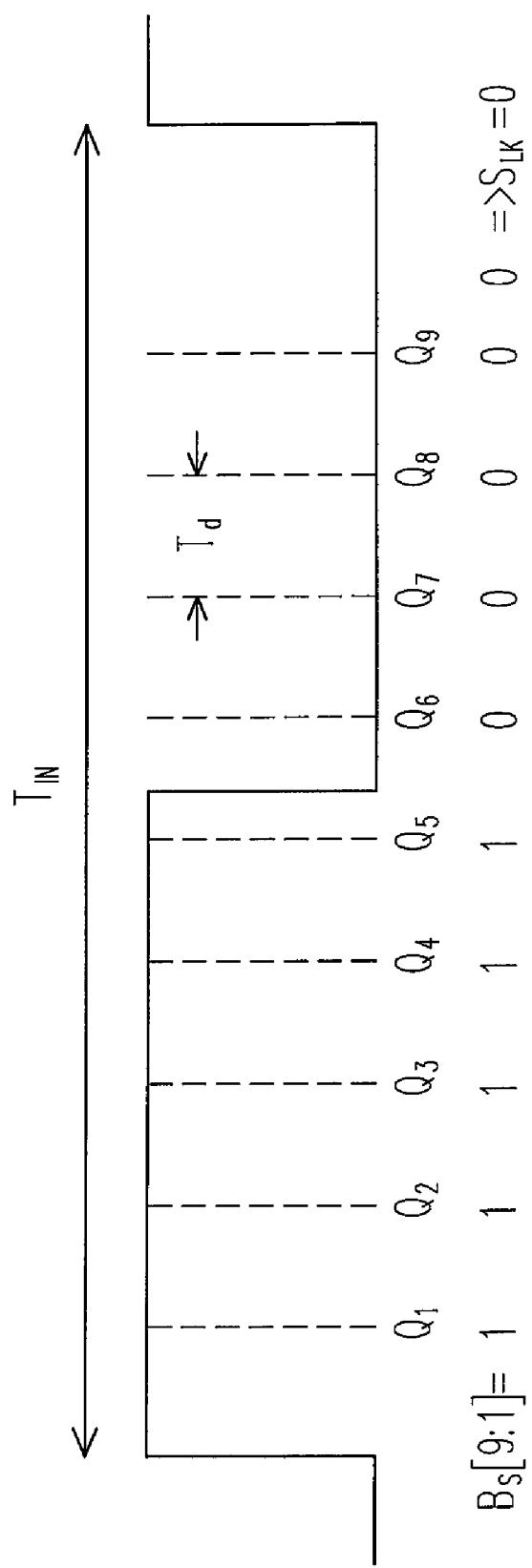
FIG. 5 is a sampling timing diagram of the phase detecting unit when the delay control code is over large.

Comparatively, when the phase detecting unit 210 outputs the counting information $S_{CT}$, the sampling timing diagram of the phase detecting unit 210 is shown in FIG. 4 or FIG. 5. When the sampling timing diagram of the phase detecting unit 210 as shown in FIG. 4, the digital delay locked loop 200 acquires that the delay control code Bd is too small according to the counting information $S_{CT}$. Referring to FIG. 4, at this time, the total delay time of the controllable delay circuits $DEL_1$-$DEL_8$ is smaller than ½ time period (½ $T_{IN}$) of the positive received signal $V_{IN+}$. Therefore, the sample output code Bs[9:1] obtained at the sampling points $Q_1$-$Q_9$ is 111111111, and the phase detecting unit 210 generates the counting information $S_{CT}$ at the logic high level (e.g., logic 1) by judging the sample output code Bs[9:1].

In another aspect, when the sampling timing diagram of the phase detecting unit 210 is as shown in FIG. 5, the digital delay locked loop 200 acquires that the delay control code Bd is over large according to the counting information $S_{CT}$. Referring to FIG. 5, at this time, the total delay time of the controllable delay circuits $DEL_1$-$DEL_8$ is greater than ½ time period (½ $T_{IN}$) of the positive received signal $V_{IN+}$. Therefore, the sample output code Bs[9:1] obtained at the sampling points $Q_1$-$Q_9$ is 111110000, and the phase detecting unit 210 generates the counting information $S_{CT}$ at the low logic level (e.g., logic 0) by judging the sample output code Bs[9:1].

Furthermore, when one bit of the sample output code Bs[$2^K$:1] is at low level, it means that the delay control code Bd must be reduced. Therefore, the phase detecting unit 210 outputs the counting information $S_{CT}$ at the low logic level. On the contrary, when the phase detecting unit 210 outputs the counting information $S_{CT}$ at the logic high level, it means that the delay control code Bd must be increased. In other words, the Boolean formula of the counting information $S_{CT}$ is expressed as Formula (2):

$$S_{CT}=Bs[1]\cdot Bs[2]\cdot Bs[3]\ldots Bs[2^K]\qquad(2)$$

Referring to FIG. 2 again, the delay control unit 220, the controllable delay circuit $DEL_1$-$DEL_N$ and the phase detecting unit 210 form a feedback mechanism. When the phase detecting unit 210 compares to obtain a phase difference between the positive received signal $V_{IN+}$ and the phase locked signal, the delay control unit 220 provides and regulates the delay control code Bd according to the counting information $S_{CT}$ and the locked information $S_{LK}$. For example, the delay control unit 220 enables the delay control code Bd to increase or reduce according to the counting information $S_{CT}$, and enables the delay control code Bd to remain unchanged according to the locked information $S_{LK}$. Thus, the digital phase locked loop 200 keeps regulating the phase locked signal until the phase locked signal and the positive received signal $V_{IN+}$ have opposite phases through the feedback mechanism.

Figure 6:
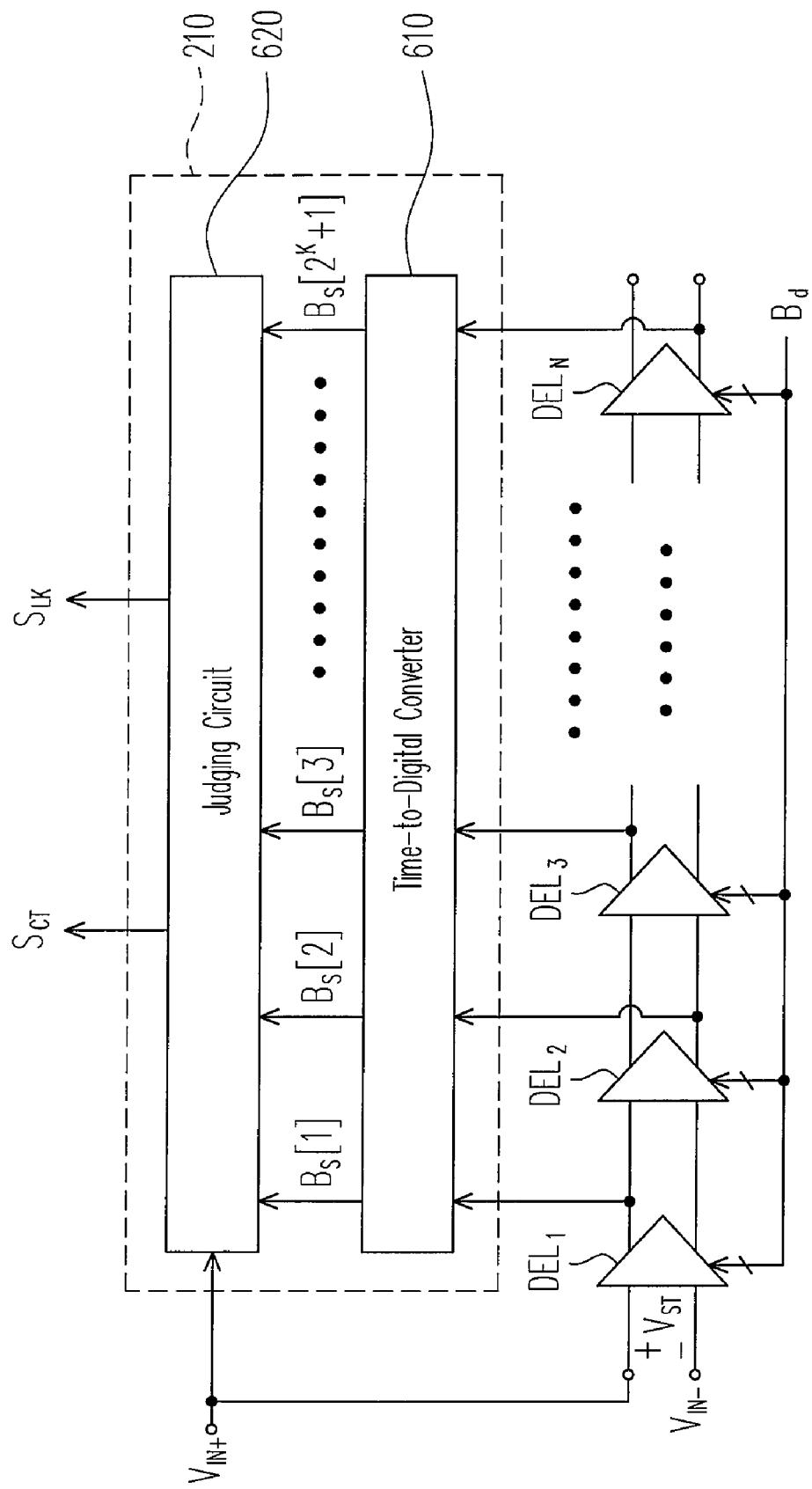
FIG. 6 is an architectural view of a phase detecting unit according to an embodiment of the present invention.

FIG. 6 is an architectural view of a phase detecting unit according to an embodiment of the present invention. Referring to FIG. 6, a phase detecting unit 210 includes a time-to-digital converter 610 and a judging circuit 620. The time-to-digital converter 610 is coupled to output ends of the controllable delay circuits $DEL_1$-$DEL_N$. The judging circuit 620 is coupled to the time-to-digital converter 610.

Referring to FIG. 6 again, the time-to-digital converter 610 samples the positive received signal $V_{IN+}$ in the specific period signal $V_{ST}$ at the transition points of the specific period signal $V_{ST}$ transmitted by each of the controllable delay circuits $DEL_1$-$DEL_N$, so as to generate a sample output code $Bs[1]$-$Bs[2^K+1]$. Next, the judging circuit 620 generates the counting information $S_{CT}$ or the locked information $S_{LK}$ according to the sample output code $Bs[1]$-$Bs[2^K+1]$. For example, when $Bs[1]$-$Bs[2^K]$ are at high level and $Bs[2^K+1]$ is at low level, i.e., when the sample output code is the specific sample code, the judging circuit 620 generates the locked information $S_{LK}$. Otherwise, the judging circuit 629 generates the counting information $S_{CT}$ according to $Bs[1]$-$Bs[2^K]$.

Figure 7:
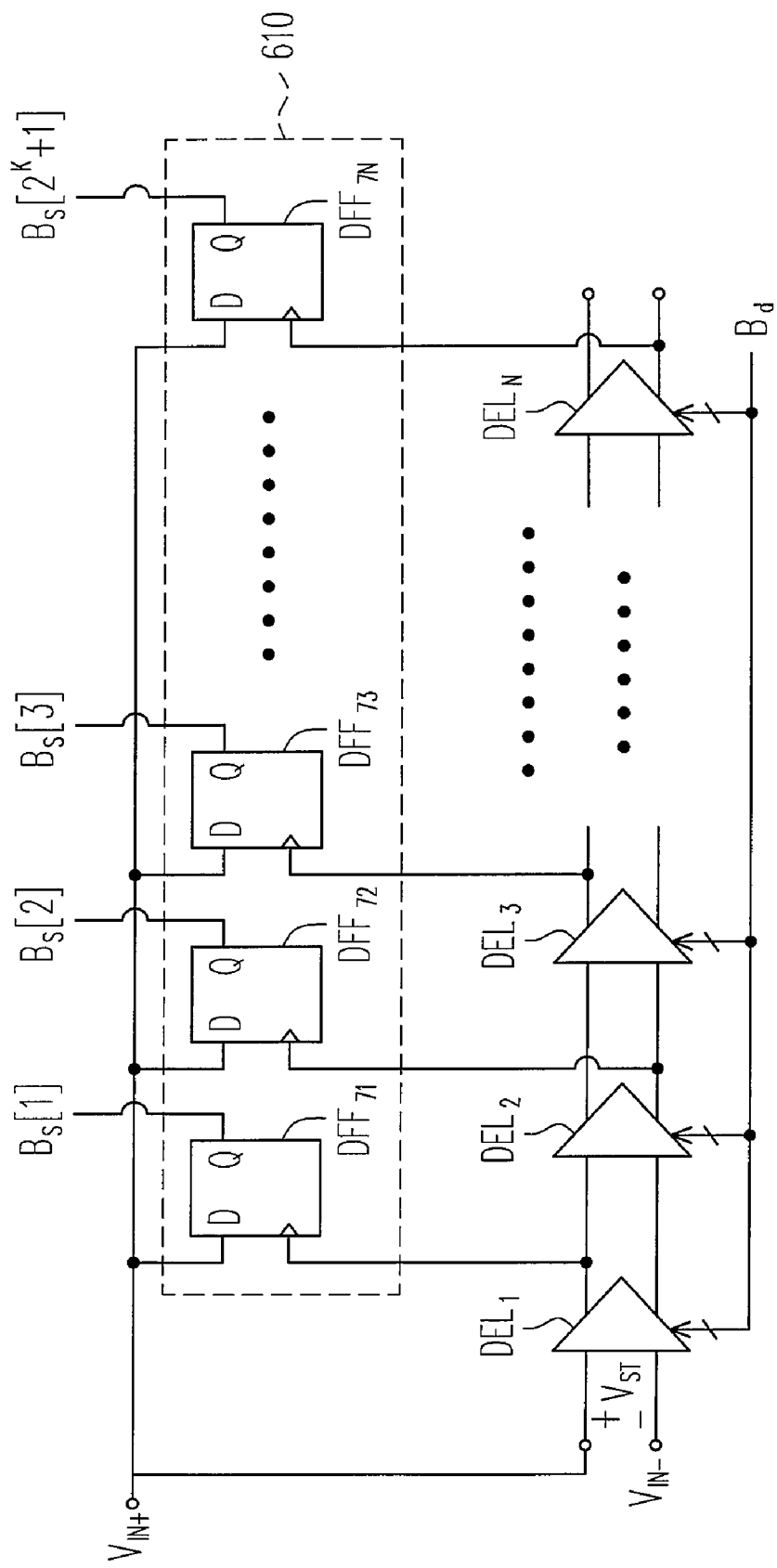
FIG. 7 is an architectural view of a time-to-digital converter according to an embodiment of the present invention.

In order to make the embodiment of the present invention apparent to persons skilled in the art, the time-to-digital converter 610 and the judging circuit 620 will be further illustrated below. FIG. 7 is an architectural view of the time-to-digital converter according to the embodiment of the present invention. Referring to FIG. 7, in the example according to the embodiment of FIG. 2, i.e., when the digital phase locked loop 200 includes $2^K+1$ controllable delay circuits ($N=2^K+1$), and the bits of the sample output code are represented as $Bs[1]$-$Bs[2^K+1]$, the time-to-digital converter 610 includes ($2^K+1$) flip-flops $DFF_{71}$-$DFF_{7N}$.

Referring to FIG. 7 again, as input ends of the flip-flops $DFF_{71}$-$DFF_{7N}$ receive the positive received signal $V_{IN+}$ in the specific period signal $V_{ST}$, outputs of the flip-flops $DFF_{71}$-$DFF_{7N}$ can be regarded as sampled results of the positive received signal $V_{IN+}$ at a plurality of sampling points. Moreover, a trigger end of the flip-flop $DFF_{7x}$ is also coupled to the output end of the controllable delay circuit $DEL_X$, where X is an integer, $1 \leq X \leq N$, and $N=2^K+1$. The delay time corresponding to each of the controllable delay circuits $DEL_1$-$DEL_N$ is Td.

Therefore, starting from the transition points of the positive received signal $V_{IN+}$, after a delay time Td, $Bs[1]$ is obtained at the output end of the flip-flop $DFF_{71}$. Next, after the next delay time Td, $Bs[2]$ is obtained at the output end of the flip-flop $DFF_{72}$. The time points that $Bs[3]$-$Bs[2^K+1]$ are generated can be similarly derived. In other words, referring to FIGS. 3-5, the time-to-digital converter 610 samples the positive received signal $V_{IN+}$ once after every delay time Td.

It should be noted that when each of the controllable delay circuits adopts the double-ended input and double-ended output design, and the phase of the specific period signal $V_{ST}$ is inverted once each time passing through one controllable delay circuit, the trigger ends of the odd-numbered flip-flops are coupled to positive output ends of the corresponding controllable delay circuits, and the trigger ends of the even-numbered flip-flops are coupled to negative output ends of the corresponding controllable delay circuits. Moreover, the flip-flops $DFF_{71}$-$DFF_{7N}$ are D flip-flops.

Figure 8:
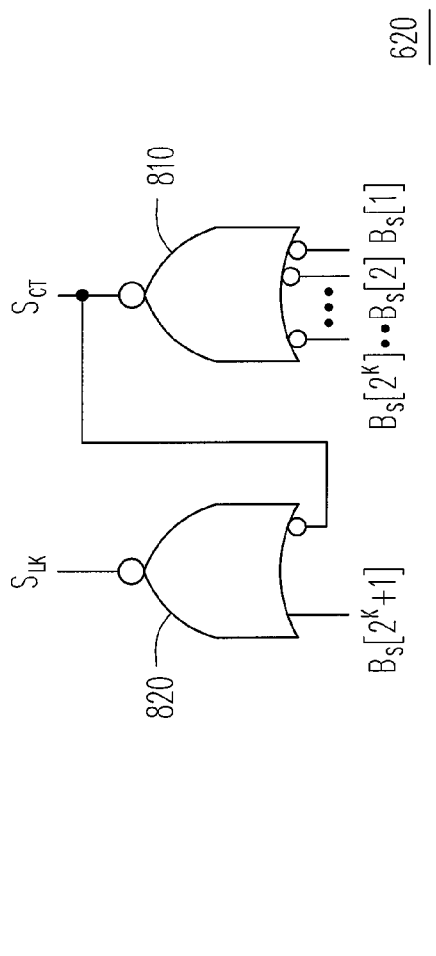
FIG. 8 is an architectural view of a judging circuit according to an embodiment of the present invention.

FIG. 8 is an architectural view of the judging circuit according to the embodiment of the present invention. Referring to Boolean formulae of the locked information $S_{LK}$ (and the counting information $S_{CT}$, i.e., Formula (1) and Formula (2), it can be deduced that the judging circuit 620 includes NOR gates 810 and 820. The NOR gate 810 receives the anti-phase levels of $Bs[1]$-$Bs[2^K]$ to generate the counting information $S_{CT}$. The NOR gate 820 receives the anti-phase levels of the counting information $S_C$ and $Bs[2^K+1]$ to generate the locked information $S_{LK}$.

Figure 9:
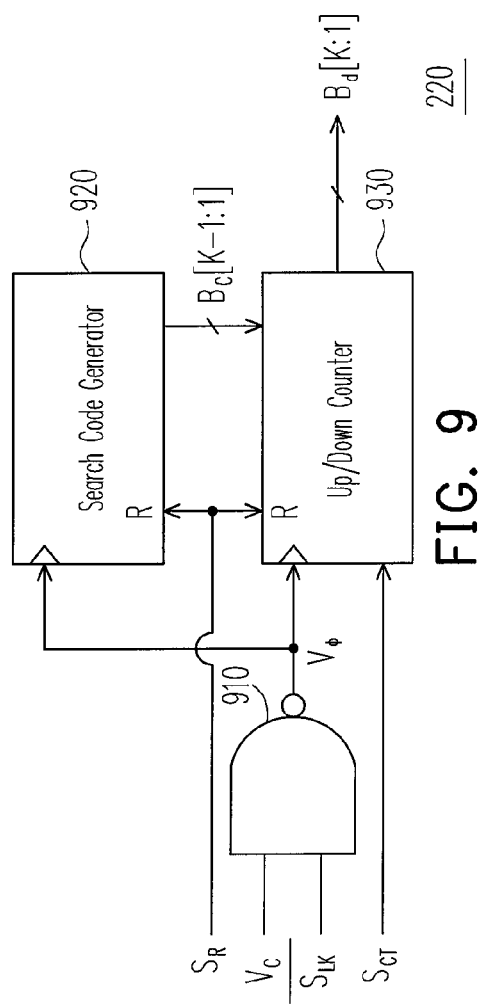
FIG. 9 is an architectural view of a delay control unit according to an embodiment of the present invention.

FIG. 9 is an architectural view of the delay control unit 220 according to the embodiment of the present invention. Referring to FIG. 9, the delay control unit 220 includes an NAND gate 910, a search code generator 920, and an up/down counter 930. Trigger ends of the search code generator 920 and the up/down counter 930 are coupled to the NAND gate 910, and the up/down counter 930 is coupled to the search code generator 920.

Referring to FIG. 9 again, the delay control unit 220 is used together with a counting signal $V_C$ to regulate the delay control code Bd, and the period of the counting signal $V_C$ is twice the period of the specific period signal $V_{ST}$. Comparatively, the search code generator 920 and the up/down counter 930 perform action according to a trigger signal $V_\phi$. Here, the NAND gate 910 receives the anti-phase level of the locked information $S_{LK}$ and the counting information $V_C$, so as to generate the trigger signal $V_\phi$. Thus, when the delay control unit 220 receives the locked information SLIT (logic 1), the up/down counter 930 stops up/down counting. On the contrary, when the delay control unit 220 receives the counting information $S_{CT}$, the up/down counter 930 performs up/down counting according to the counting information $S_{CT}$ and the counting search code Bc.

In another aspect, as the delay control unit 220 combines the binary counting method and the sequential counting method to search the delay control code Bd, the search code generator 920 generates the counting search code Bc according to the binary counting method and the sequential counting method. Thus, the up/down counter performs up/down counting according to the counting information $S_{CT}$ and the counting search code Bc, so as to generate the delay control code Bd.

It should be noted that if the resolution of the counting search code Bc is K bits which are represented as $Bc[1]$-$Bc[K]$ respectively, and if the resolution of the delay control code Bd is also K bits, the bits are represented as $Bd[1]$-$Bd[K]$ respectively, wherein K is an integer. Here, the search code generator 920 receives a reset information SR, so as to reset $Bc[K]$ to the high level and reset $Bc[K-1]$-$Bc[2]$ to the low level. In another aspect, the up/down counter 930 also receives the reset information SR to reset $Bd[K]$ to the high level and to reset $Bd[K-1]$-$Bd[2]$ to the low level. However, in order to meet the requirements of the operating mechanism of the binary counting method and the sequential counting method, the up/down counter 930 only receives the $(K-1)^{th}$ to the $1^{st}$ bits (Bc[K-1:1]) in the counting search code.

Figure 10:
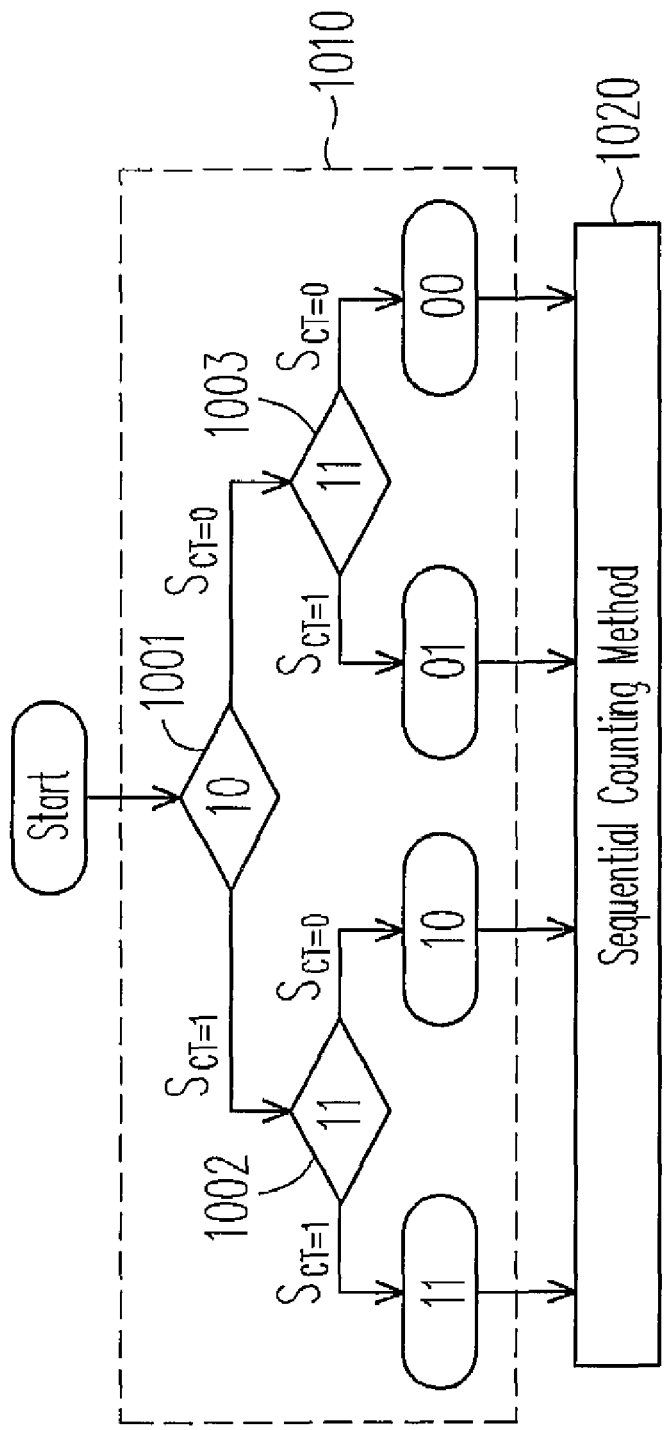
FIG. 10 is a flow chart of the method that combines a binary counting method and a sequential counting method.

For example, the flow chart of the method combining the binary counting method and the sequential counting method shown as FIG. 10 is taken as an example to illustrate the process how the delay control unit 220 generates the delay control code Bd[2:1]. Referring to FIG. 10, K=2 is taken as an example, i.e., the 2-bit delay control code Bd is taken as an example. In the course of generating the delay control code Bd[2:1], the delay control unit 220 performs the binary counting method 1010 first, and then performs the sequential counting method 1020. The binary counting method 1010 includes a plurality of counting steps, which are illustrated in detail as follows.

In step 1001, the binary counting method sets Bd[2:1] to 10. Next, Bd[2:1] is made to increase or reduce according to the counting information $S_{CT}$. For example, if the delay control code Bd[2:1] is determined to be too small in step 1001 ($S_{CT}$=1), the binary counting method performs step 1002, so as to further set Bd[2:1] to be 11. On the contrary, the binary counting method performs step 1003, so as to set Bd[2:1] to 01.

Thus, after the determination in step 1001, the value of Bd[2] is determined. Similarly, after the determination in step 1002 or step 1003, the value of Bd[1] is determined. In other words, the binary counting method determines the highest bit first, and then sequentially determines the next bit until the lowest bit of the delay control code is determined.

Figure 11:
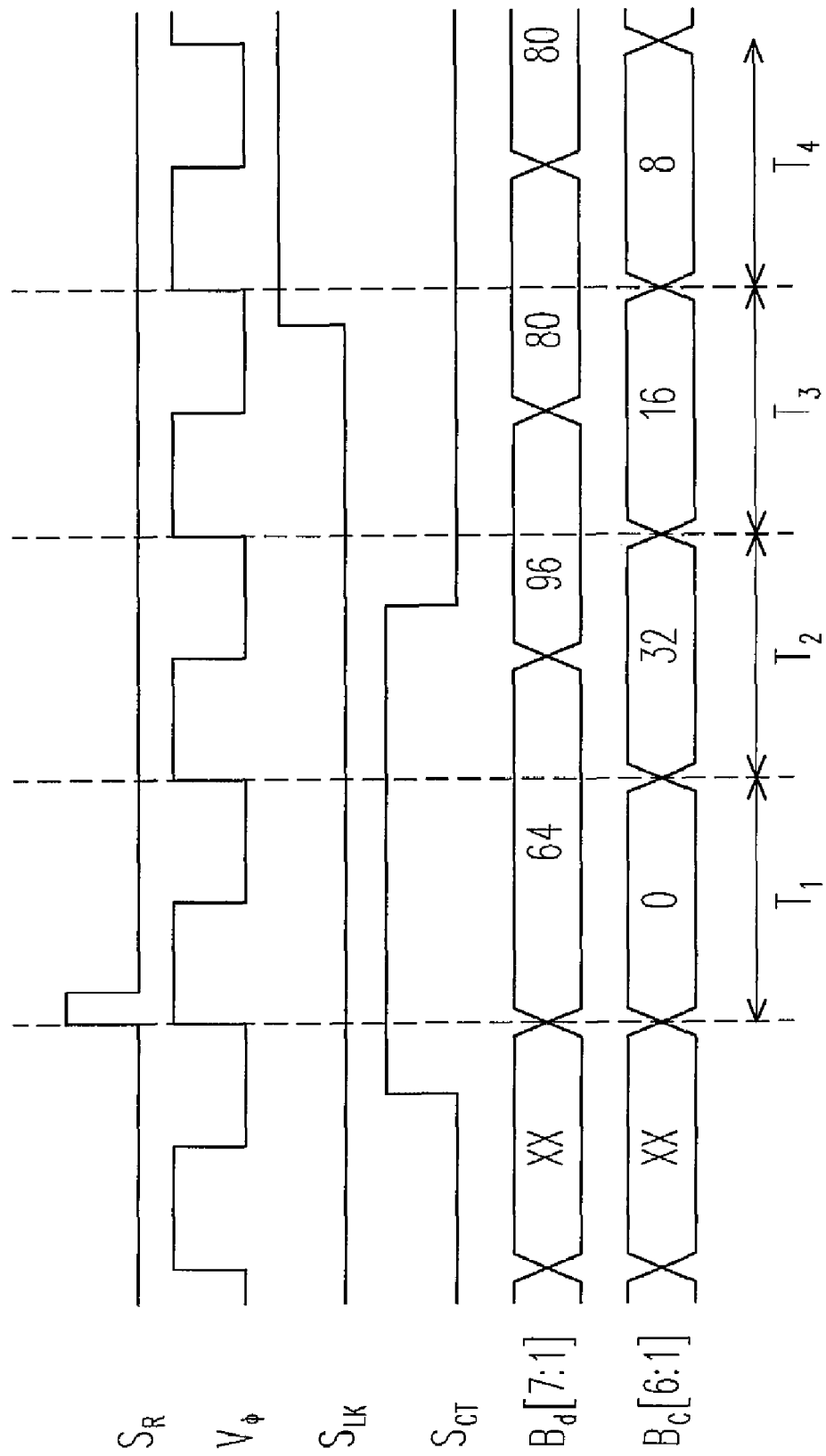
FIG. 11 is a timing diagram of the operating mechanism of a search code generator and an up/down counter.

Next, the operating mechanism of the search code generator 920 and the up/down counter 930 is illustrated with reference to the timing diagram of FIG. 11. In the embodiment of FIG. 11, K=7 is taken as an example, i.e., at this time, the delay control code is represented as Bd[7:1], and the counting search code received by the up/down counter 930 is represented as Bc[6:1]. Referring to FIGS. 9 and 11 together, the search code generator 920 sequentially generates the counting search code Bc according to the trigger signal $V_\phi$. In a first period T1, the search code generator 920 and the up/down counter 930 reset the delay control code Bd[7:1] to $1000000_2=64_{10}$, and reset the counting search code Bc[6:1] to $000000_2=0_{10}$ according to the reset information SR.

When the trigger signal $V_\phi$ performs the next positive transition, i.e., in a second period T2, as the phase detecting unit 210 does not generate the locked signal ($S_{LK}$=0), the delay control unit 220 enables the delay control code Bd to increase or reduce according to the counting information $S_{CT}$. At this time, from the counting information $S_{CT}$ at high level, the up/down counter 930 acquires that the sample output code must increase, so the delay control code Bd[7:1]=$64_{10}$ generated in the first period T1 and the counting search code Bc[6:1]=$32_{10}$ generated in a second period T2 are added, so as to regulate the delay control code to Bd[7:1]=$96_{10}$.

Similarly, in a third period T3, as the phase detecting unit 210 does not generate the locked information $S_{LK}$, the delay control unit 220 enables the delay control code Bd to increase or reduce according to the counting information $S_{CT}$. At this time, from the counting information $S_{CT}$ at low level, the up/down counter 930 acquires that the sample output code must be reduced, so the counting search code Bc[6:1]=$16_{10}$ generated in the third period T3 is subtracted from the delay control code Bd[7:1]=$96_{10}$ generated in the second period T2, so as to regulate the delay control code to Bd[7:1]=$80_{10}$.

After that, in a fourth period T4, the phase detecting unit 210 acquires that the digital delay locked loop 200 is in the locked state according to the locked information $S_{LK}$. Therefore, the up/down counter 930 stops up/down counting at this time, so as to maintain the delay control code at Bd[7:1]=$80_{10}$. In order to make the embodiment of the present invention apparent to persons skilled in the art, the search code generator 920 and the up/down counter 930 will be further illustrated below.

Figure 12:
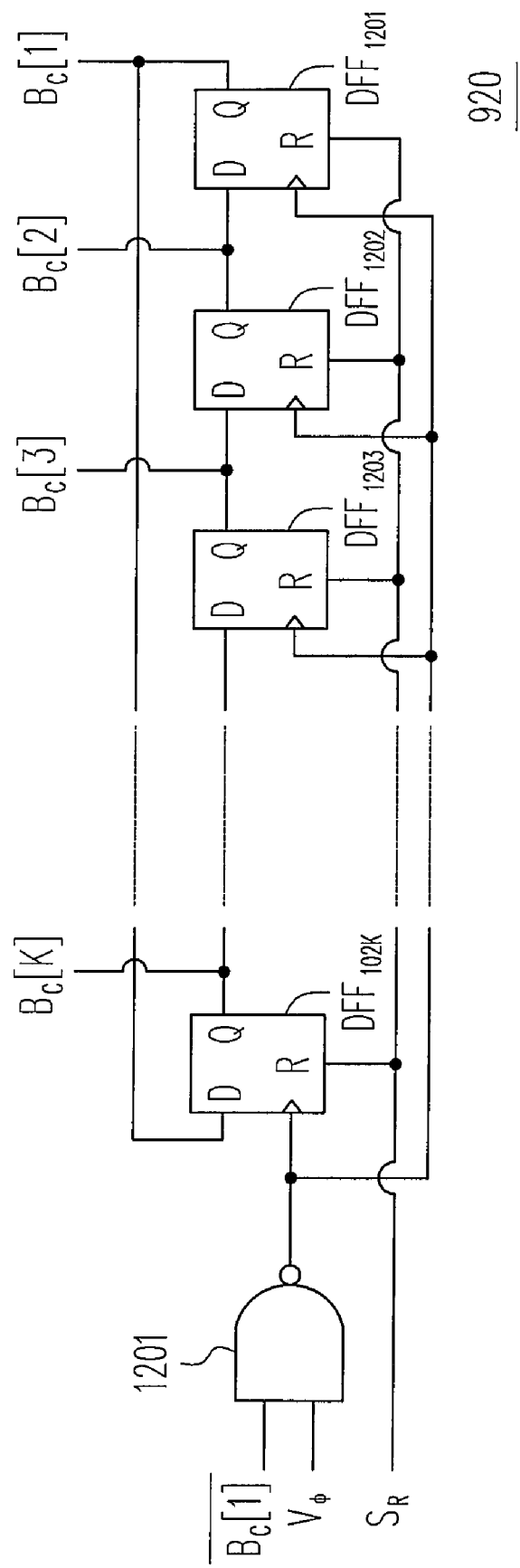
FIG. 12 is an architectural view of a search code generator according to an embodiment of the present invention.

FIG. 12 is an architectural view of a search code generator according to the embodiment of the present invention. Referring to FIG. 12, the search code generator 920 includes an NAND gate 1201 and flip-flops $DFF_{1201}$-$DFF_{120K}$, wherein K is a positive integer. A first end of the NAND gate 1201 is coupled to the output end of the NAND gate 910, and an output end of the NAND gate 1201 is coupled to trigger ends of the flip-flops $DFF_{1201}$-$DFF_{120K}$. The flip-flops $DFF_{1201}$-$DFF_{120K}$ are connected in series to form a ring counter.

As reset ends of $DFF_{1201}$-$DFF_{1201}$ receive the reset signal SR, at the beginning, the rest Bc[1]-Bc[K-1] are at low level except that the Bc[K] obtained at the output end of $DFF_{120K}$ is at high level. Next, in the ring architecture formed by $DFF_{1201}$-$DFF_{120K}$, only one bit from Bc[1]-Bc[K] is at high level at a same time point, and the high level starts from Bc[K] and moves to the next bit sequentially until Bc[1] is at high level.

In another aspect, as the NAND gate 1201 receives the trigger signal $V_\phi$, and anti-phase levels of Bc[1], when Bc[1] remains at low level, $DFF_{1201}$-$DFF_{120K}$ generates the counting search code Bc required by the binary counting method according to the trigger signal $V_\phi$. On the contrary, when Bc[1] is at high level, $DFF_{1201}$-$DFF_{120K}$ generates the counting search code required by the sequential counting method. It should be noted that when the resolution of the delay control code Bd is also K bits, though the up/down counter 930 only uses the counting search code Bc of (K-1) bits, in order to meet the requirement that the original value of the counting search code Bc used by the up/down counter 930 must be 0, the search code generator 920 generates the K-bit counting search code to maintain the normal operation of the ring counter.

Figure 13:
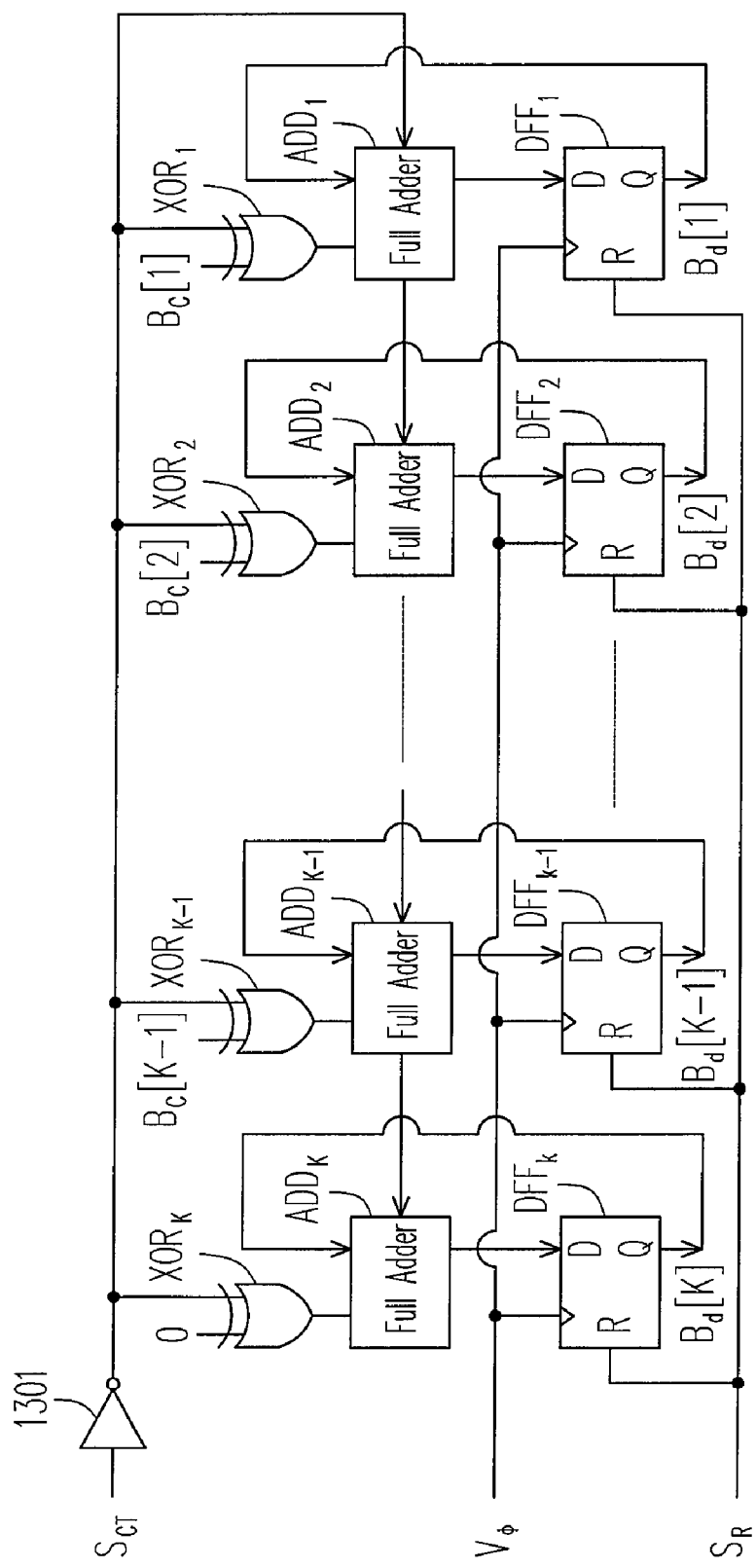
FIG. 13 is an architectural view of an up/down counter according to an embodiment of the present invention.

FIG. 13 is an architectural view of an up/down counter according to the embodiment of the present invention. Referring to FIG. 13, the up/down counter 930 includes an inverter 1301, XOR gates $XOR_1$-$XOR_K$, full adders $ADD_1$-$ADD_K$, and flip-flops $DFF_1$-$DFFK_K$, wherein K is a positive integer. First ends of $XOR_1$-$XOR_K$ are coupled to the inverter 1301, and the output end of $XOR_S$ is coupled to the first input end of ADDS. Carry input ends of the full adders $ADD_1$-$ADD_K$ are connected in series with the carry output end, and the carry input end of the full adder $ADD_1$ is coupled to the output end of the inverter 1301. In addition, the input end of the flip-flop $DFF_S$ is coupled to sum output end of the full adder ADDS, the output end of the flip-flop $DFF_S$ is coupled to second input end of the full adder $ADD_S$, and trigger ends of the flip-flops $DFF_1$-$DFFK_K$ are coupled to the NAND gate 910, wherein s is an integer, and $1 \leq s \leq K$.

Referring to FIG. 13, a second end of the XOR gate $XOR_1$ is coupled to the low level, and the second end of the XOR gate $XOR_Z$ is used to receive Bc[Z], where Z an integer, and $1 \leq Z \leq K-1$. The second input end of the flip-flop DFFs generates Bd[s]. As the function of the flip-flops $DFF_1$-$DFF_K$ is equivalent to a register, the full adders $ADD_1$-$ADD_K$ enable the delay control code Bd that is originally registered in the flip-flops $DFF_1$-$DFF_K$ to be added to or subtracted from the counting search code Bc through the regulation of the XOR gates $XOR_1$-$XOR_K$ and the inverter 1301.

For example, when the counting information $S_{CT}$ received by the inverter 1301 is at high level, the up/down counter 930 enables the delay control code Bd that is originally registered in the flip-flops $DFF_1$-$DFF_K$ to be added to the counting search code Bc. On the contrary, when the counting information received by the inverter 1301 is at low level, the up/down counter 930 enables the delay control code Bd that is originally registered in the flip-flops $DFF_1$-$DFF_K$ to be subtracted from the counting search code Bc. Similarly, the reset ends of the flip-flops $DFF_1$-$DFF_K$ receive the reset information $S_R$, so as to reset Bd[K] to the high level, and to reset Bd[K−1]-Bd[2] to the low level. In another aspect, the trigger ends of the flip-flops $DFF_1$-$DFF_K$ receive the trigger signal $V_\phi$, such that the flip-flops $DFF_1$-$DFF_K$ perform up/down counting according to the trigger signal $V_\phi$.

It should be noted that though the controllable delay circuit adopting the double-ended design is taken as an example to illustrate the embodiment of the present invention, persons skilled in the art shall understand that the delay circuit includes various types of architecture. Therefore, persons skilled in the art can replace the controllable delay circuit with any type of delay circuits without departing from the spirit of the present invention. However, in order to make the spirit of the present invention more apparent to persons skilled in the art, an embodiment using the controllable delay circuit is illustrated below, and the embodiment is not intended to limit the present invention.

Figure 14:
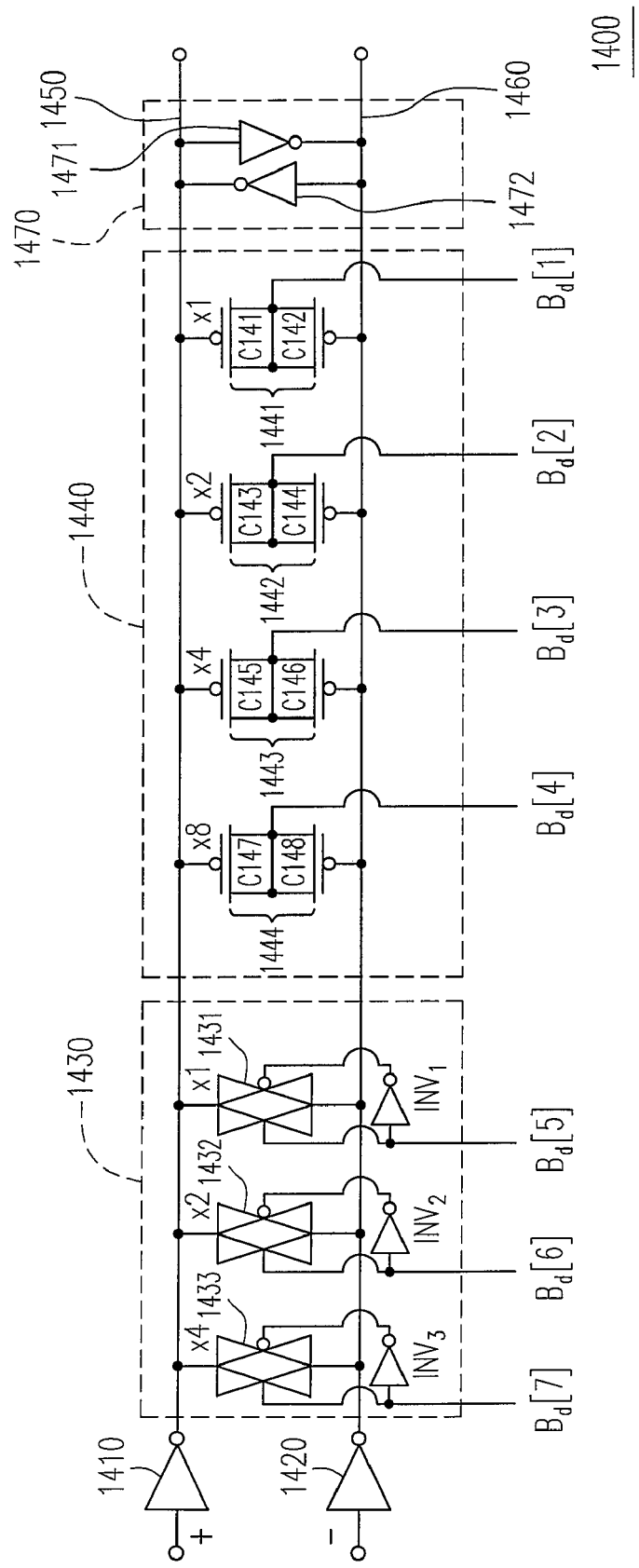
FIG. 14 is an architectural view of a controllable delay circuit according to an embodiment of the present invention.

FIG. 14 is an architectural view of a controllable delay circuit according to an embodiment of the present invention. Referring to FIG. 14, a controllable delay circuit 1400 includes inverters 1410 and 1420, a variable resistance unit 1430, a variable capacitance unit 1440, and a phase clamping unit 1470. Output ends of the inverters 1410 and 1420 are coupled to signal lines 1450 and 1460 respectively, and the variable resistance unit 1430 and the variable capacitance unit 1440 are coupled between the signal lines 1450 and 1460.

Before illustrating various blocks, it must be made clear that the delay control Bd of 7 bits (K=7) is taken as an example to illustrate the embodiment of FIG. 14, and Bd[1]-Bd[4] are a set of less significant bits, Bd[5]-Bd[7] are a set of more significant bits, Bd[1] is the least significant bit, and Bd[7] is the most significant bit.

The controllable delay circuit 1400 can regulate the delay time it provides according to the delay control code Bd through the variable resistance unit 1430 and the variable capacitance unit 1440. The variable resistance unit 1430 regulates an equivalent resistance between the signal lines 1450 and 1460 according to Bd[5]-Bd[7], and the variable capacitance unit 1440 regulates an equivalent capacitance between the signal lines 1450 and 1460 according to Bd[1]-Bd[4].

Referring to FIG. 14, the variable resistance unit 1430 includes transmission gates 1431-1433 and inverters $INV_1$-$INV_3$. First connection ends of the transmission gates 1431-1433 are coupled to the signal line 1450, and second connection ends of the transmission gates 1431-1433 are coupled to the signal line 1460. An input end of the inverter $INV_1$ is coupled to a first gate of the transmission gate 1431, and an output end of the inverter $INV_1$ is coupled to a second gate of the transmission gate 1431. An input end of the inverter $INV_2$ is coupled to a first gate of the transmission gate 1432, and an output end of the inverter $INV_2$ is coupled to a second gate of the transmission gate 1432. The coupling manner of the inverter $INV_3$ can be derived from the above description.

The variable resistance unit 1430 regulates the equivalent resistance between the signal lines 1450 and 1460 according to whether the transmission gates 1431-1433 are conducted or not. The ON/OFF state of the transmission gate 1431 is controlled by Bd[5] through the inverter $INV_1$. Similarly, the ON/OFF states of the transmission gates 1432 and 1433 are controlled by Bd[6] and Bd[7] through the inverters $INV_2$ and $INV_3$ respectively. Thus, the variable resistance unit 1430 can regulate the equivalent resistance between the signal lines 1450 and 1460 according to Bd[5]-Bd[7].

It should be noted that the variable resistance unit 1430 increases device sizes of the transmission gates 1432 and 1433 by a power of 2 with reference to the device size of the transmission gate 1431.

In another aspect, the variable capacitance unit 1440 includes variable capacitors 1441-1444. A first connection end of the variable capacitor 1441 is coupled to the signal line 1450, and a second connection end of the variable capacitor 1441 is coupled to the signal line 1460. In addition, a first connection end of the variable capacitor 1442 is coupled to the signal line 1450, and a second connection end of the variable capacitor 1442 is coupled to the signal line 1460. The coupling manner of the variable capacitors 1443 and 1444 can be derived from the above description.

Furthermore, each of the variable capacitors 1441-1444 includes 2 capacitors. For example, the variable capacitor 1441 includes capacitors C141 and C142. A first end of the capacitor C141 is coupled to the signal line 1450, a second end of the capacitor C141 is coupled to a first end of the capacitor C142, and a second end of the capacitor C142 is coupled to the signal line 1460. Similarly, the variable capacitor 1442 includes capacitors C143 and C144. A first end of the capacitor C143 is coupled to the signal line 1450, a second end of the capacitor C143 is coupled to a first end of the capacitor C144, and a second end of the capacitor C144 is coupled to the signal line 1460. The components and the coupling manner of the variable capacitors 1443 and 1444 can be derived from the above description.

The variable capacitance unit 1440 regulates the equivalent capacitance between the signal lines 1450 and 1460 by changing the capacitance of the variable capacitors 1441-1444. The capacitance of the variable capacitor 1441 is controlled by Bd[1]. Similarly, the capacitances of the variable capacitors 1442-1444 are controlled by Bd[2]-Bd[4] respectively. Thus, the variable capacitance unit 1440 can regulate the equivalent capacitance between the signal lines 1450 and 1460 according to Bd[1]-Bd[4].

It should be noted that the variable capacitance unit 1440 increases the capacitance values of the variable capacitors 1442-1444 by a power of 2 with reference to the capacitance value of the variable capacitor 1441. For example, if the capacitance value of the variable capacitor 1441 is 0.2 farad, then the capacitance value of the variable capacitor 1442 is 0.4 farad, the capacitance value of the variable capacitor 1443 is 0.8 farad and the capacitance value of the variable capacitor 1444 is 1.6 farad. In addition, the capacitors C141-C148 forming the variable capacitors 1441-1444 are PMOS capacitors.

Moreover, the phase clamping unit 1470 includes inverters 1471 and 1472. An input end of the inverter 1471 is coupled to the signal line 1450, and an output end of the inverter 1471 is coupled to the signal line 1460. An input end of the inverter 1472 is coupled to the signal line 1460, and an output end of the inverter 1472 is coupled to the signal line 1450. Here, the controllable delay circuit 1400 can use the phase clamping unit 1470 to enable the output signals of the inverters 1410 and 1420 have opposite phases.

To sum up, the present invention uses the combination of the phase detecting unit and a plurality of controllable delay circuits, such that the phase detecting unit samples the positive received signal at the transition points of the specific period signal transmitted by each of the controllable delay circuits.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital delay locked loop, comprising:
   a plurality of controllable delay circuits, connected in series, each of the controllable delay circuits transmitting a specific period signal according to delay time determined by a delay control code;
   a phase detecting unit, coupled to each of the controllable delay circuits, for sampling the specific period signal at the transition points of the specific period signal transmitted by each of the controllable delay circuits to generate a sample output code, and determining the sample output code to provide a counting information, wherein when the sample output code is a specific sample code, the digital delay locked loop remains in the locked state; and
   a delay control unit, coupled to the phase detecting unit, for enabling the delay control code to increase or reduce according to the counting information.

2. The digital delay locked loop as claimed in claim 1, wherein the digital delay locked loop generates a phase locked signal through one of the controllable delay circuits in the locked state, and wherein the phase locked signal and the specific period signal have opposite phases.

3. The digital delay locked loop as claimed in claim 1, wherein a duty cycle of the specific period signal is 50%.

4. The digital delay locked loop as claimed in claim 1, wherein a resolution of the specific sample code is $(2^K+1)$ bits, a $1^{st}$ to a $(2^K)^{th}$ bits of the specific sample code are at high level, and a $(2^K+1)^{th}$ bit is at low level, and wherein K is a positive integer.

5. The digital delay locked loop as claimed in claim 1, wherein the phase detecting unit comprises:
   a time-to-digital converter, sampling the specific period signal at the transition points of the specific period signal transmitted by each of the controllable delay circuits, so as to generate the sample output code, wherein a resolution of the sample output code is $(2^K+1)$ bits which are represented as $Bs[1]$-$Bs[2^K+1]$ respectively, and wherein K is a positive integer; and
   a judging circuit, coupled to the time-to-digital converter, for generating a locked information when the sample output code is the specific sample code, or generating the counting information according to $Bs[1]$ to $Bs[2^K]$.

6. The digital delay locked loop as claimed in claim 5, wherein the time-to-digital converter comprises:
   $(2^K+1)$ flip-flops, an input end of each of the flip-flops receiving the specific period signal, an output end of the $X^{th}$ flip-flop acquiring $Bs[X]$, and a trigger end of the $X^{th}$ flip-flop being coupled to an output end of the $X^{th}$ controllable delay circuit, wherein X is an integer, and $1 \leq X \leq 2^K+1$.

7. The digital delay locked loop as claimed in claim 6, wherein each of the controllable delay circuits employs a double-ended input and double-ended output design, and a phase of the specific period signal is inverted once each time passes through one of the controllable delay circuits, the trigger ends of odd-numbered flip-flops are coupled to positive output ends of corresponding controllable delay circuits, and the trigger ends of even-numbered flip-flops are coupled to negative output ends of corresponding controllable delay circuits.

8. The digital delay locked loop as claimed in claim 6, wherein the flip-flops comprise D flip-flops.

9. The digital delay locked loop as claimed in claim 5, wherein the judging circuit comprises:
   a first NOR gate, receiving anti-phase levels of $Bs[1]$-$Bs[2^K]$ to generate the counting information; and
   a second NOR gate, receiving anti-phase levels of the counting information and $Bs[2^K+1]$ to generate the locked information.

10. The digital delay locked loop as claimed in claim 1, wherein when the sample output code is the specific sample code, the phase detecting unit provides a locked information, and the delay control unit regulates the delay control code according to a counting signal, and the delay control unit comprises:
    a first NAND gate, for receiving anti-phase levels of the locked information and the counting signal, wherein a period of the counting signal is twice that of the specific period signal;
    a search code generator, having a trigger end coupled to the first NAND gate, for combining a binary counting method and a sequential counting method to generate a counting search code; and
    an up/down counter, having a trigger end coupled to the first NAND gate, for performing up/down counting according to the counting information and the counting search code, so as to generate the delay control code.

11. The digital delay locked loop as claimed in claim 10, wherein a resolution of the counting search code is K bits which are represented as $Bc[1]$-$Bc[K]$ respectively, the search code generator resets $Bc[K]$ to the high level, and resets $Bc[K-1]$-$Bc[1]$ to the low level according to a reset information, and wherein K is a positive integer.

12. The digital delay locked loop as claimed in claim 11, wherein the search code generator comprises:
    a second NAND gate, having a first end coupled to the first NAND gate and a second end receiving an anti-phase level of $Bc[1]$; and
    K flip-flops connected in series, a trigger end of each of the flip-flops being coupled to the second NAND gate, and a reset end of each of the flip-flops acquiring $Bc[Y]$, wherein Y is an integer, and $1 \leq Y \leq K$.

13. The digital delay locked loop as claimed in claim 10, wherein a resolution of the delay control code is K bits which are represented as $Bd[1]$-$Bd[K]$ respectively, the up/down counter resets $Bd[K]$ to the high level, and resets $Bd[K-1]$-$Bd[1]$ to the low level according to a reset information, wherein K is a positive integer.

14. The digital delay locked loop as claimed in claim 13, wherein the up/down counter comprises:
    an inverter, for receiving the counting information;
    K XOR gates, having first ends coupled to the inverter, a second end of the $Z^{th}$ XOR gate receiving a $Z^{th}$ bit of the counting search code, a second end of the $K^{th}$ XOR gate being coupled to the low level, wherein Z is an integer, and $1 \leq Z \leq K-1$;
    K full adders, each of the full adders comprising a first input end, a second input end, a carry input end, a carry output end, and a sum output end, the full adders connected in series through the carry input ends and the carry output ends, wherein the carry input end of the $1^{st}$ full adder is coupled to the inverter, the first input end of the $s^{th}$ full adder is coupled to the $s^{th}$ XOR gate, wherein s is an integer, and $1 \leq s \leq K$; and
    K flip-flops, an input end of the $s^{th}$ flip-flop being coupled to the sum output end of the $s^{th}$ full adder, the output end of the $s^{th}$ flip-flop is coupled to the second input end of the $s^{th}$ full adder to generate Bd[s], a trigger end of each of the flip-flops being coupled to the first NAND gate, and a reset end of each of the flip-flops receiving the reset signal.

15. A digital delay locked loop, for regulating a positive received signal to a phase locked signal, comprising:

a plurality of controllable delay circuits connected in series, each of the controllable delay circuits sequentially transmitting the positive received signal and a negative received signal according to delay time determined by a delay control code, and the positive received signal and the negative received signal constituting a specific period signal;

a phase detecting unit, coupled to each of the controllable delay circuits, for sampling the positive received signal at the transition points of the specific period signal transmitted by each of the controllable delay circuits, and determining sample results to provide a counting information or a locked information; and a delay control unit, coupled to the phase detecting unit, for providing and regulating the delay control code according to the counting information and the locked information;

wherein the digital delay locked loop is locked and generates the phase locked signal through one of the controllable delay circuits according to the locked information, and the delay control unit enables the delay control code to increase or reduce according to the counting information.

16. The digital delay locked loop as claimed in claim 15, wherein the locked signal and the positive received signal have opposite phases.

17. The digital delay locked loop as claimed in claim 15, wherein a duty cycle of the positive received signal is 50%.

18. The digital delay locked loop as claimed in claim 15, wherein the phase detecting unit comprises:

a time-to-digital converter, sampling the positive received signal at the transition points of the specific period signal transmitted by each of the controllable delay circuits, so as to generate a sample output code, wherein a resolution of the sample output code is ($2^K+1$) bits which are represented as Bs[1]-Bs[$2^K+1$] respectively, wherein K is a positive integer; and a judging circuit, coupled to the time-to-digital converter, for generating the locked information when Bs[1]-Bs[$2^K$] are at high level and Bs[$2^K+1$] is at low level, and otherwise generating the counting information according to Bs[1] to Bs[$2^K$].

19. The digital delay locked loop as claimed in claim 15, wherein the delay control unit regulates the delay control code according to a counting signal, and the delay control unit comprises:

a first NAND gate, for receiving anti-phase levels of the locked information and the counting signal, wherein a period of the counting signal is twice that of the specific period signal;

a search code generator, having a trigger end coupled to the first NAND gate, for generating a counting, search code according to a binary search algorithm; and an up/down counter, having a trigger end coupled to the first NAND gate, for performing up/down counting according to the counting, information and the counting search code, so as to generate the delay control code.

20. The digital delay locked loop as claimed in claim 19, wherein a resolution of the counting search code is K bits which are represented as Bc[1]-Bc[K] respectively, the search code generator resets Bc[K] to the high level, and resets Bc[K−1]-Bc[1] to the tow level according to a reset information, wherein K is a positive integer.

21. The digital delay locked loop as claimed in claim 19, wherein a resolution of the delay control code is K bits which are represented as Bd[1]-Bd[K] respectively, the up/down counter resets Bd[K] to the high level, and resets Bd[K−1]-Bd[1] to the low level according to a reset information, wherein Id is a positive integer.

* * * * *